United States Patent [19]

Ervasti

[11] Patent Number: 5,627,502
[45] Date of Patent: May 6, 1997

[54] RESONATOR FILTER WITH VARIABLE TUNING

[75] Inventor: Kimmo Ervasti, Varjakka, Finland

[73] Assignee: LK Products Oy, Kempele, Finland

[21] Appl. No.: 391,192

[22] Filed: Jan. 26, 1995

[30] Foreign Application Priority Data

Jan. 26, 1994 [FI] Finland ............................. 940388

[51] Int. Cl.$^6$ ...................... H01P 1/20; H01P 1/213
[52] U.S. Cl. ................... 333/134; 333/174; 333/175; 333/202; 333/235; 333/207
[58] Field of Search ................................. 333/202, 204, 333/205, 219, 206, 207, 235

[56] References Cited

U.S. PATENT DOCUMENTS

| 3,387,886 | 6/1968 | Takalo et al. | 333/136 |
|---|---|---|---|
| 3,600,708 | 8/1971 | King | 333/202 |
| 3,617,954 | 11/1971 | Levy et al. | 333/204 |
| 3,733,608 | 5/1973 | McGhay et al. | 333/134 |
| 3,815,137 | 6/1974 | Kaegebein | 343/180 |
| 4,459,571 | 7/1984 | Fraser | 333/202 |
| 4,682,131 | 7/1987 | May | 333/202 |
| 4,799,034 | 1/1989 | Siverman et al. | 333/202 |
| 5,227,748 | 7/1993 | Sroka | 333/207 |

FOREIGN PATENT DOCUMENTS

| 0481607A1 | 9/1991 | European Pat. Off. | H03H 7/12 |
|---|---|---|---|
| 2210749 | 6/1989 | United Kingdom | H03H 7/01 |

OTHER PUBLICATIONS

The European Search Report —Abstract/Title/Figure —Date May 31, 1996.

Primary Examiner—Benny Lee
Assistant Examiner—Darius Gambino
Attorney, Agent, or Firm—Darby & Darby

[57] ABSTRACT

An advantageous embodiment of the invention is the filter of the receiver branch of the duplex filter in a multi-channel radio transmitter/receiver having reception and transmission bands composed of plural radio-frequency channels. In the first state of the filter, when the radio transmitter/receiver is only receiving radio signals, the width of the pass band of the filter corresponds to said reception band. In the second state, in which the radio transmitter/receiver additionally transmits radio signals, the pass band of the filter is switched by current control to cover only part of the reception band. By constructing the filter in the manner proposed it is possible to use current control in the first resonator in the filter of the receiver branch. Because of its power consumption current control is otherwise unsuitable for use in e.g. the duplex filter of a portable radio-telephone.

11 Claims, 2 Drawing Sheets

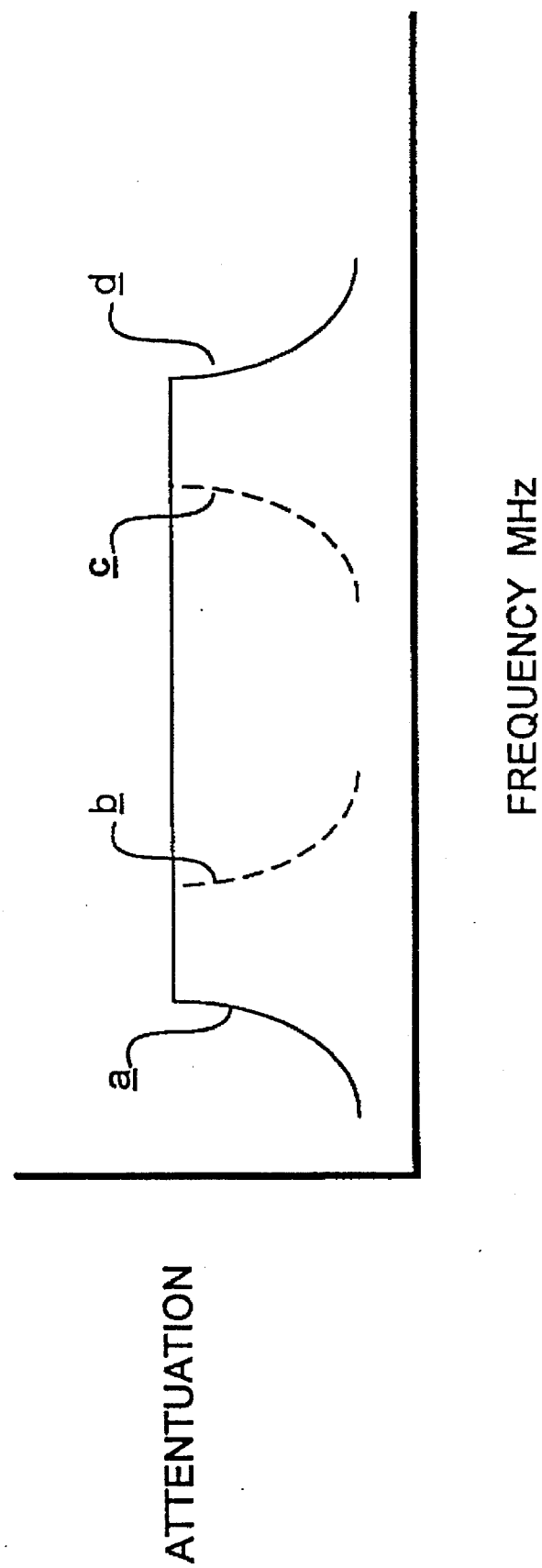

RESONATOR FILTER WITH VARIABLE TUNING

BACKGROUND OF THE INVENTION

Field of the Invention

The invention relates to a filter in general and in particular to a duplex filter for use in connection with a transmitter/receiver.

Radio apparatus which comprises both a transmitter and a receiver using a common antenna usually requires a duplex filter which correctly directs the signal being transmitted and the signal being received. The received signal coming from the antenna must be directed to the receiver without the transmitter causing significant losses. Likewise, the signal being transmitted must be directed to the antenna without the receiver causing significant losses. A duplex filter can be constructed, for example, of helix resonators or of ceramic resonators, and the type and number of resonators with which the filter is realized depends on the requirements set for the filter.

As portable telephones have become ever smaller and lighter and the requirements for the reduction of their power consumption have increased, the requirements set for the filters have become more stringent. Particularly stringent requirements apply to the duplex filter, since, traditionally, it has been the largest filter in the telephone. At the present state of the art this is a difficult task to achieve, since the size of helix filters and dielectric filters is determined mainly by the electrical properties of the individual resonators, such as the resonant frequency, quality factor and the bandwidth of the filter.

In order to be able to construct a filter with the required pass bands while maintaining sufficient attenuation of the stop bands, a certain number of resonators are required for each branch of the duplex filter. Typically, in a cellular telephone the transmitter branch of the filter comprises four resonator circuits, while in the receiver branch it is possible to manage with three resonator circuits. The seven resonator circuits in this example thus determine the physical length of the duplex filter.

It is known that the number of resonators can be reduced by making at least some of them variable. Because, for example, in the cellular telephone system the transmission and reception bands used by the system consist of the bands defining the individual channels, the pass bands of the filters of one or both of the filter branches can be made fairly narrow while nevertheless covering the entire frequency range required by shifting the frequency response of the filter in the frequency plane, which means changing the centre frequency of the filter. In a variable filter the resonance frequencies of the individual resonators are adjusted to provide a filter having the desired frequency response. The final result is that with a smaller number of resonators it is nevertheless possible to cover the desired frequency range.

The adjustment of the individual resonators can be voltage controlled continuous adjustment or current controlled switched adjustment. In switched adjustment the control change shifts the frequency step-wise to the new value. Usually switched adjustment has two positions. The general trend is to use switched adjustment in the filter of the transmitter branch, in the TX filter, because a filter having this type of adjustment is more easily constructed to withstand the high power of the transmitter. A filter having continuous voltage controlled adjustment does not withstand high powers, so that it is suitable for adjustment of the final resonator, seen from the antenna, of the filter of the receiver branch, the RX filter, but the resonator nearest the antenna must be adjusted by switched current control because this resonator circuit must withstand fairly high power since it reflects back the transmitter power while the transmitter is active.

However, this is a considerable disadvantage since current control consumes the telephone's power continuously. In a hand-held telephone as a result of this additional power consumption the standby time falls to almost one third compared with a non-variable duplex filter. Naturally this is not acceptable in a hand-held telephone. Accordingly in state of the art variable filters the resonator nearest the antenna is fixed and not adjustable.

SUMMARY OF THE INVENTION

The present invention presents a filter which does not have the aforementioned disadvantages and in which the fixed resonator or resonators are replaced by a frequency-adjustable current-controlled resonator without substantially increasing the current consumption of the telephone.

The invention makes use of the fact that for most of the time the telephone is in use it is in the standby mode, in which the telephone listens for any incoming calls, and that only a small part of the total time of use is active speaking time for which the transmitter is on. Thus only a small part of the total time is such that the filter of the RX branch of the duplex filter is required to withstand high power.

With this is in mind, in one aspect the present invention provides a variable filter formed by a plurality of resonators electromagnetically coupled to one another, characterised in that a first of the resonators, positioned first in the direction of travel of an input signal, is a resonant frequency-adjustable resonator controlled by external current, the filter being controllable between a first state in which its pass band is broad to a second state in which its pass band is narrow by the application of a first external control current.

Thus, it will be appreciated that if the duplex filter is constructed with such a filter in the RX branch, the current-controlled variable resonator is able to withstand high power from the transmitter.

When the telephone is in the first state or standby mode, the current control of the resonators is not in use, so that the mode can be described as a rest state of the filter. In this rest state the band width of the filter is broad and a sufficiently low, pass attenuation is provided throughout the entire frequency band to permit the reception of signals. The stop attenuation of the filter in this broad-band state is poor, but this is not a problem because the transmitter is not in operation; the telephone is in standby mode and just listening to the call channel. The only power loading is the low power of the received signal.

When changing from standby mode to call mode (the second state), the telephone's transmitter is switched on. At the same time, the current controlled resonators of the filter of the receiver branch receive a first external control current causing a change in the band width of the filter so it becomes narrow. In this narrow band state the stop attenuation of the filter is high and the filter is able to withstand the transmitter power. In the narrow band state the band of the RX filter does not cover all the reception bands of the multi-channel radio-telephone system used, but this is not a problem because in this state the band of the filter is adjusted by current and voltage control in any known way so that its pass attenuation is low and its stop attenuation is high for the reception channel in use at that moment.

BRIEF DESCRIPTION OF THE DRAWINGS

An exemplary embodiment of the present invention is described in more detail with the aid of the accompanying drawing wherein:

FIG. 2 illustrates a graph depicting the frequency response characteristics of the duplex filter of FIG. 1.

DETAILED DESCRIPTION

Figure 1:
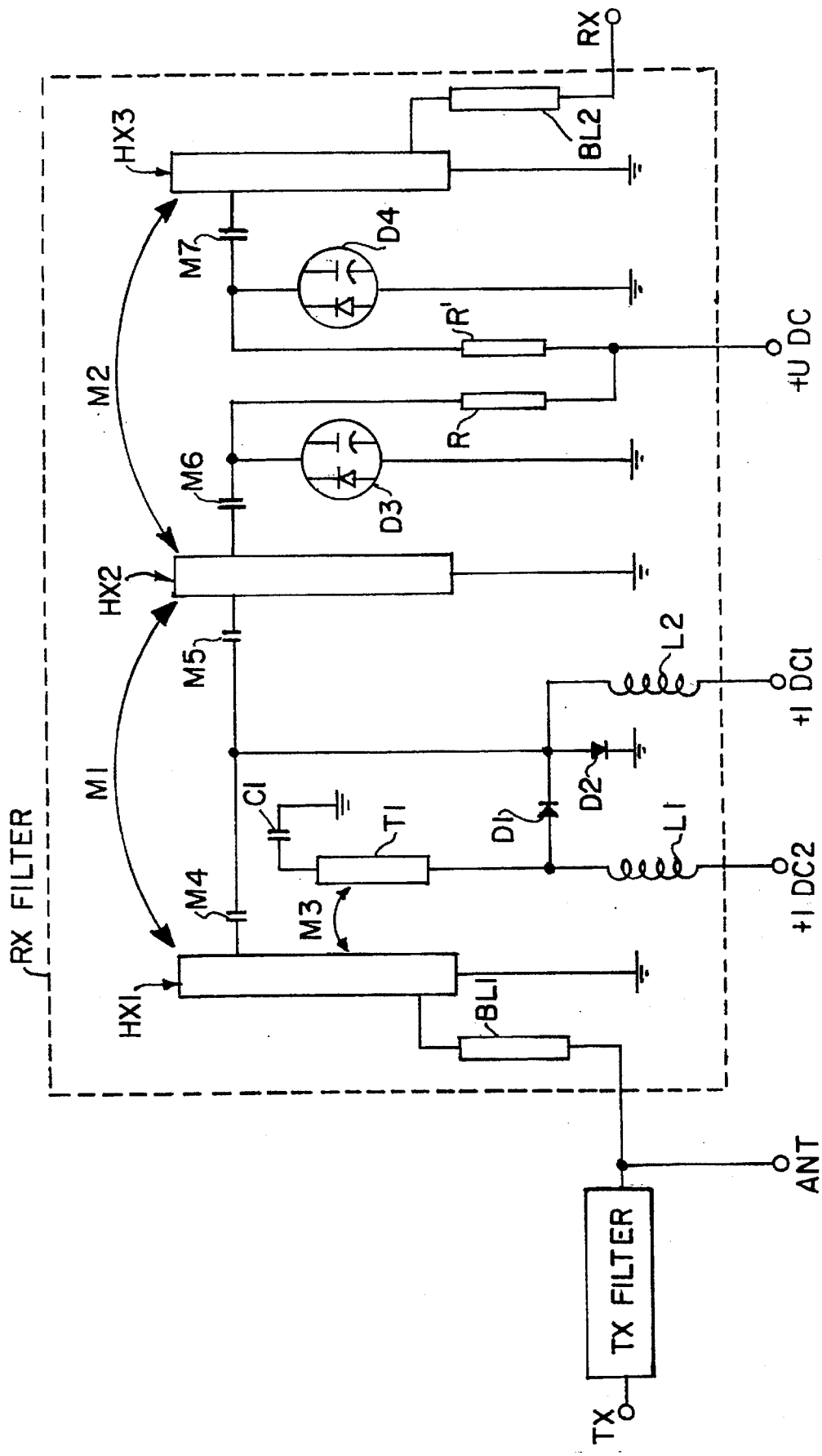
FIG. 1 illustrates a duplex filter in accordance with the present invention.

The filter comprises three signal connections: the TX connection where the transmitter signal enters the filter, the RX connection from which the received signal goes to the receiver, and the antenna connection ANT. The filter of the TX branch of the duplex filter is shown indicated merely as a block since it is not essential to the invention. The filter of the RX branch comprises three resonators HX1, HX2 and HX3 coupled to each other by electromagnetic fields M1 and M2 forming a filter of the bandpass type. The resonators may be, for example, helix resonators, but the invention is suitable for use with any type of resonator. The coupling elements BL1 and BL2 are matching elements for feeding the RF signal to and from the filter respectively.

The resonant frequencies of the resonators HX2 and HX3 can be adjusted continuously by control voltage +U DC. The control circuit of resonator HX2 comprises a series circuit formed by coupling capacitor M6 and varactor diode D3, the series circuit being electrically parallel with the resonant circuit of the resonator. One electrode of the coupling capacitor may be formed by the upper end of the resonator and the other electrode by a metal plate near to the upper end. In the case of a helix resonator the coupling may also be by direct contract with a turn of the helix, i.e. by tapping. Correspondingly the frequency control circuit of resonator HX3 comprises a series circuit formed by a coupling capacitor M7 and varactor diode D4, the series circuit being electrically parallel with the resonant circuit of the resonator. By applying a DC voltage via resistors R and R' to the cathodes of the varactor diodes the capacitance of the diodes is changed as the voltage changes. The total capacitance of the resonant circuit is thereby also changed with a corresponding change in resonant frequency. The frequency control can also be variable if the value of the control voltage +U DC is adjustable. This method of voltage control of the frequency of resonators HX2 and HX3 is known to those skilled in the art and also any other known method of voltage control may be used.

The manner in which current control of resonator HX1 is arranged will now be examined. The frequency control circuit is formed by inductive elements L1 and L2 which act as RF separators and through which external control currents +I DC2 and +I DC1 respectively are fed to the circuit. The circuit additionally comprises diodes D1 and D2, coupling capacitors M4 and M5 as well as a capacitor C1 to separate the control current. In the electromagnetic field of resonator HX1 there is a subsidiary resonator T1 so that the coefficient of electromagnetic coupling between these resonators is M3. A subsidiary resonator is known per se, for example from the previously mentioned Patent Application FI-88442.

While a telephone according to the invention is in the standby mode no power consuming current control is used. The external control currents +I DC2 and +I DC1 are then zero. The subsidiary resonator T1 has no effect and the only effective factor is the additional coupling formed by coupling capacitors M4 and M5 (diode D2 is not conducting) that acts in parallel with the coupling M1 which occurs through the electromagnetic field between resonators HX1 and HX2. The additional coupling causes an increase in the total coupling between the resonators which in turn broadens the pass band of the filter composed of resonators HX1, HX2 and HX3 to at least the width of the entire pass band in use (the reception band of the telephone system).

As a result a uniform pass attenuation is obtained throughout the frequency band. The voltage controlled resonators HX2 and HX3 can of course be adjusted all the time also in the standby mode and thereby the pass attenuation can be optimized even separately for each channel if this should be considered necessary. The stop attenuation at the transmitter frequency is poor in the standby mode, but this is of no significance since the RX stop attenuation is required to attenuate the transmitter power and in the standby mode the transmitter is switched off. The resonant frequency of HX1 is tuned optimally to the centre of the reception frequency band.

When the telephone is switched to call mode the transmitter is switched on. In this mode the stop attenuation of the RX filter (e.g., the passband indicated between lines a and b of FIG. 2) should be much higher than in the standby mode (e.g., the passabnd indicated between lines a and d of FIG. 2). The increased stop attenuation is obtained by switching on the control current +I DC1, whereby D2 becomes conducting and grounds the coupling M4 and M5 which is in parallel with the coupling M1. With the disappearance of the additional coupling the total coupling between HX1 and HX2 is reduced and as a consequence the pass band of the filter is narrowed and the requirements for stop attenuation are met. Because the control current +I DC2 is still zero, the subsidiary resonator T1 does not have any effect on the operation of the filter.

Grounding of coupling capacitors M4 and M5 causes a frequency shift in the resonant frequencies of resonators HX2 and HX1 which thereby tune to a lower frequency. The frequency shift is desired, however, only in resonator HX1, so that the magnitude of the coupling M4 is chosen from the outset to be suitable from the viewpoint of tuning. The optimal frequency shift is approx. ¼ of the reception frequency band, assuming that the resonant frequency of HX1 in standby mode is in the centre of the frequency band. The strength of the coupling of coupling capacitor M4 to HX1 is thus determined by the frequency shift desired, so that its value should be large. The capacitor M4 is ten times larger than the capacitor M5, and thus the magnitude of the additional coupling M4, M5 between resonators HX1 and HX2 is determined almost entirely by coupling MS. The strength of the coupling of coupling capacitor M5 to HX2 accordingly becomes so weak (small capacitance) that it does not even significantly affect the resonant frequency of HX2.

If for some reason it is necessary to make the coupling so large that its effect on the frequency of HX2 becomes a disturbing factor, then the matter is readily corrected by providing HX2 with a separate control voltage +U DC, whereby the resonant frequency can be corrected to that desired. This is not shown in the drawing but the method is known to those skilled in the art.

The frequency of HX1 is thus now adjusted to ¼ of the frequency band below the centre of the frequency band, and is accordingly in the centre of the lower half of the frequency band. Fine adjustment for individual channels of the pass and stop attenuation in the lower half of the range is made by stepless adjustment of resonators HX2 and HX3. This is the case when the current reception channel is located in the lower half of the frequency band.

When the reception channel is located in the upper half of the frequency band (e.g., the passband indicated between lines c and d of FIG. 2), +I DC1 is switched off and +I DC2 is switched on, and the control current passes through diodes D1, D2. The conducting diodes ground the open end of subsidiary resonator T1. The other end of the resonator is already grounded with respect to radio frequency signals through capacitor C1, which has a value chosen to be a short circuit at radio frequencies (e.g. 100 pF). The change of this subsidiary resonator from a quarter-wave resonator to a half-wave resonator causes, through the coupling M3, a shift in the resonant frequency of HX1 from the centre of the lower half to the centre of the upper half of the frequency band. This principle has already been patented and is disclosed in more detail in the Applicant's FI Patent No. 88442. Fine adjustment for individual channels is made in the same way as for the lower half of the frequency band by adjusting the control voltage +U DC of the voltage controlled resonators HX2 and HX3.

In FIG. 2 the frequency differences have been exaggerated for emphasis.

Within the spirit and scope of the accompanying claims the invention can be implemented in numerous different manners, of which the example presented above is only one of many. The claims do not place any restrictions on the manner in which the frequencies and circuits of the resonators are adjusted or changed. Further, the resonator could be of some type other than a helix resonator, for example a ceramic resonator, rod resonator, strip resonator etc.

We claim:

1. A duplex filter formed by a plurality of resonators electromagnetically coupled together, wherein a first of the resonators, positioned first in the direction of travel of an input signal, is a resonant frequency-adjustable resonator controlled by separate first and second control signals, the filter being controllable between a first state effected by the first control signal in which its passband is narrowed to a first bandwidth in a first frequency range and a second state effected by the second control signal in which its narrowed passband is moved to a second frequency range.

2. The filter according to claim 1, including a first means operable in response to the first external control signal to decrease the coupling between two adjacent resonators, thereby narrowing the pass band of the filter.

3. A filter according to claim 2, wherein the first means includes an additional capacitative coupling in parallel with the coupling between the two adjacent resonators, which additional coupling is grounded on application of the first external control signal, thereby decreasing the coupling between said two adjacent resonators.

4. A filter according to claim 1, including a second means operable in response to the second external control signal to change the resonant frequency of the first resonator.

5. A filter according to claim 4, wherein the second means comprises a subsidiary resonator located in the electromagnetic field of the first resonator, which subsidiary resonator in response to introduction of the second external control signal switches from a quarter-wave resonator to a half-wave resonator.

6. A filter according to claim 1, including a third means, which in response to a control voltage continuously varies the resonant frequencies of at least some of the resonators, enabling fine adjustment by said control voltage of the stop and pass attenuations of the filter in both of its states.

7. A filter according to claim 1, wherein at least some of the resonators have associated individual means, which in response to a control voltage continuously vary the resonant frequency of the associated resonator, enabling fine adjustment by said control voltage of the stop and pass attenuations of the filter in both of its states.

8. A multi-channel radio transmitter/receiver having reception and transmission bands composed of plural radio-frequency channels and a duplex filter comprising a variable filter as in claim 1 in its receiver branch, wherein while the variable filter is in the first state the width of the pass band of the variable filter corresponds to the reception band of the radio transmitter/receiver, and while in the second state the width of the pass band of the variable filter is only part of the reception band.

9. A transmitter/receiver according to claim 8, wherein in the second state the pass band of the variable filter corresponds to the lower half band of the reception band and the resonant frequency of the first resonator is at the centre of the lower half band, and on application of the second external control signal the resonant frequency of the first resonator shifts to the centre of the upper half band, and the pass band of the filter corresponds to the upper half band of the reception band.

10. A duplex filter with a receiver branch and a transmitter branch for a frequency division duplex telephone transceiver, the duplex filter including a variable filter in its receiver branch, the variable filter comprising:

i) at least first and second resonators electromagnetically coupled to each other and forming a bandpass filter arrangement; and ii) control circuitry coupled to the first and second resonators to control the bandwidth of the receiver branch in response to .separate first and second control signals by controlling the coupling between the first and second resonators, said first control signal causing said control circuitry to effect a narrowing of the passband to a first bandwidth in a first frequency range and said second control signal causing said control circuitry to effect a move of the narrowed passband to a second frequency range.

11. A method of tuning a duplex filter having a transmitter branch and a receiver branch with first and second resonators whose electromagnetic coupling to each other is controlled by control signals to form a variable receiver bandpass filter arrangement, the method comprising the steps of:

(a) applying a first voltage control signal to at least the first resonator to narrow the bandwidth of the bandpass filter to a first bandwidth in a first frequency range; and (b) applying a separate second voltage control signal to at least the first resonator to move the narrowed bandwidth to a second frequency range.

* * * * *